(12) United States Patent
Ang et al.

(10) Patent No.: US 8,143,695 B1
(45) Date of Patent: Mar. 27, 2012

(54) CONTACT FUSE ONE TIME PROGRAMMABLE MEMORY

(75) Inventors: Boon Y. Ang, Sunnyvale, CA (US); Serhii Tumakha, San Jose, CA (US); Amit Ghia, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 125 days.

(21) Appl. No.: 12/509,301

(22) Filed: Jul. 24, 2009

(51) Int. Cl.
    *H01L 23/52* (2006.01)
(52) U.S. Cl. .................. 257/529; 257/528; 257/E21.592
(58) Field of Classification Search .................. 257/528, 257/529, E21.592
    See application file for complete search history.

(56) References Cited

U.S. PATENT DOCUMENTS

| | | | |
|---|---|---|---|
| 6,433,404 B1 | 8/2002 | Lyer et al. | |
| 6,624,499 B2 | 9/2003 | Kothandaraman et al. | |
| 6,636,433 B2 | 10/2003 | Tanikawa | |
| 6,911,360 B2 | 6/2005 | Li et al. | |
| 7,417,300 B2 | 8/2008 | Booth, Jr. et al. | |
| 7,888,771 B1 | 2/2011 | Sidhu et al. | |
| 7,923,811 B1 | 4/2011 | Im et al. | |
| 2003/0160297 A1 | 8/2003 | Kothandaraman et al. | |
| 2008/0029843 A1 | 2/2008 | Booth, Jr. et al. | |
| 2008/0089159 A1 | 4/2008 | Moy et al. | |
| 2008/0150076 A1* | 6/2008 | Nam et al. | ..................... 257/529 |
| 2008/0186788 A1 | 8/2008 | Barth | |
| 2008/0258255 A1 | 10/2008 | Ker et al. | |
| 2008/0283963 A1 | 11/2008 | Chung et al. | |
| 2009/0001506 A1 | 1/2009 | Kim et al. | |
| 2009/0057818 A1 | 3/2009 | Kim et al. | |
| 2009/0090994 A1 | 4/2009 | Kim et al. | |
| 2009/0224323 A1 | 9/2009 | Im et al. | |
| 2009/0261450 A1* | 10/2009 | Cheng et al. | ................... 257/529 |
| 2010/0148915 A1* | 6/2010 | Kuo et al. | ..................... 337/290 |

OTHER PUBLICATIONS

U.S. Appl. No. 12/488,179, filed Jun. 19, 2009, Tumakha et al.

* cited by examiner

*Primary Examiner* — Tan N Tran
(74) *Attorney, Agent, or Firm* — Kevin T. Cuenot; LeRoy D. Maunu; Lois D. Cartier (57) ABSTRACT

A fuse structure for a semiconductor integrated circuit (IC) can include a first node comprising a region of a metal layer of an IC manufacturing process and a second node comprising a region of a conductive layer residing on a layer of the IC manufacturing process below the metal layer of the first node. The fuse structure can include a fuse link comprising a conductive material, positioned substantially perpendicular to each of the metal and conductive layers. An upper end of the fuse link couples to the first node and a lower end of the fuse link, that is distal to the upper end, couples to the second node.

17 Claims, 4 Drawing Sheets

CONTACT FUSE ONE TIME PROGRAMMABLE MEMORY

FIELD OF THE INVENTION

The embodiments disclosed within this specification relate to semiconductor integrated circuit devices (ICs). More particularly, the embodiments relate to a programmable fuse structure for an IC.

BACKGROUND

One time programmable (OTP) memory is a type of memory used within semiconductor integrated circuits (ICs) to program and permanently store information. OTP memory is often implemented with a fuse structure that relies upon the severing of a fuse link to store information. Once programmed, the OTP memory cannot be rewritten as programming entails breaking the fuse link. Fuses comprise a fuse link electrically coupling two separate electrical nodes, e.g., an anode and a cathode. Upon the application of a particular stressor to the fuse, the fuse link can be "broken." The break in the fuse link creates an increase in the resistance of a conductive path, possibly an open circuit, between the two electrical nodes. Thus, the fuse has two different programmable states. The first programmable state exists when the fuse has a low resistance in the conductive path through the fuse prior to breaking the fuse link. The second programmable state exists when the fuse has a high resistance in the conductive path through the fuse subsequent to breaking the fuse link.

One type of fuse used to implement OTP memory is the electrically programmable fuse, which is often referred to as an e-fuse. To program an e-fuse, a voltage potential, with a constant polarity, is applied across a conductive fuse link via the cathode and the anode. The fuse link is typically formed of a silicided polysilicon layer overlaying a dielectric material. The applied voltage potential generates a current through the fuse link of sufficient magnitude to initiate electromigration in the silicided layer forming the fuse link.

Electromigration refers to the transportation of material by the gradual movement of ions in a conductor due to the momentum transfer between conducting electrons and diffusing metal atoms. Electromigration is more significant in IC applications where higher direct current densities occur. Current traveling through the e-fuse generates electromigration effects that migrate material away from one or more portions of the cathode, anode, or fuse link regions. The migration results in a higher resistance in the conductive path through the e-fuse. Typically, a large current density is required to flow through the fuse link to induce electromigration within the e-fuse. To generate large current densities within an e-fuse, the application of significant programming voltages to the e-fuse may be necessary.

SUMMARY

The embodiments disclosed within this specification relate to semiconductor integrated circuit devices (ICs) and, more particularly, to programmable fuses. One embodiment of the present invention can include a fuse structure for an IC. The fuse structure can include a first node comprising a region of a metal layer of an IC manufacturing process and a second node comprising a region of a conductive layer residing on a layer of the IC manufacturing process below the metal layer of the first node. The fuse structure further can include a fuse link, comprising a conductive material, positioned substantially perpendicular to each of the metal and conductive layers. An upper end of the fuse link couples to the first node and a lower end of the fuse link, that is distal to the upper end, couples to the second node.

The fuse link can be implemented using a single contact of the IC manufacturing process. The fuse structure also can include a plurality of contacts coupled to the second node. The plurality of contacts can at least partially surround the fuse link on three sides. The fuse structure further can include a dielectric layer underlying the conductive layer that electrically isolates the conductive layer from other devices on the IC.

In one aspect, the conductive layer can be a silicided polysilicon layer. In another aspect, the conductive layer can be a top layer of a metalized gate stack. In yet another aspect, the conductive layer can be a silicided diffusion region. When implemented as a silicided diffusion region, the conductive layer can be disposed within a substrate layer.

The fuse structure can include a substrate tap. The substrate tap can include at least one substrate contact overlaying a region of the substrate layer. The substrate tap electrically couples the substrate layer to a predetermined voltage potential. A well can be disposed within the substrate layer. Accordingly, the silicided diffusion region can be disposed within, and surrounded by, the well.

In one aspect, the first node is an anode and the second node is a cathode. Accordingly, during programming of the fuse structure, current flows from the first node to the second node. In another aspect, the first node is a cathode and the second node is an anode. In that case, during programming of the fuse structure, current flows from the second node to the first node.

The conductive layer and/or the fuse link can be formed of a material that demonstrates an electromigration property responsive to an applied programming voltage.

Another embodiment of the present invention can include a fuse structure for an IC. The fuse structure can include an anode comprising a first region of a metal layer of an IC manufacturing process, a cathode comprising a region of a conductive layer residing on a layer of the IC manufacturing process that is below the metal layer of the anode, and a dielectric layer underlying the conductive layer of the cathode. The dielectric layer electrically isolates the conductive layer from the surrounding IC. The fuse structure also can include a fuse link comprising a single contact. The fuse link can be positioned substantially perpendicular to each of the metal and conductive layers. An upper end of the fuse link couples to the first node and a lower end of the fuse link, that is distal to the upper end, couples to the second node.

The fuse link can include a second region of the metal layer that is separate from the first region. The second region of the metal layer can be coupled to the conductive layer of the cathode via a plurality of contacts. The plurality of contacts can at least partially surround the fuse link on three sides. The conductive layer and/or the fuse link can be formed of a material that demonstrates an electromigration property responsive to an applied programming voltage.

Another embodiment of the present invention can include a fuse structure for an IC. The fuse structure can include a well comprising an N-type or a P-type material disposed within a substrate layer of the IC, an anode comprising a first region of a metal layer of an IC manufacturing process, and a cathode comprising a region of a conductive material overlaying, and in contact with, a diffusion material disposed within the well. The fuse structure also can include a fuse link comprising a single contact positioned substantially perpendicular to each of the metal and conductive layers. An upper end of the fuse link couples to the anode and a lower end of the fuse link, that is distal to the upper end, couples to the cathode.

The fuse structure can include a second region of the metal layer that is separate from the first region. The second region of the metal layer can be coupled to the conductive layer of the cathode via a plurality of contacts. The plurality of contacts can at least partially surround the fuse link on three sides.

The fuse structure also can include a substrate tap comprising at least one substrate contact overlaying a region of the substrate layer. The substrate tap electrically couples the substrate layer to a predetermined voltage potential.

The fuse structure further can include a conductive material overlaying the diffusion material that demonstrates an electromigration property responsive to an applied programming voltage.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the embodiments of the invention.

The embodiments disclosed within this specification relate to semiconductor integrated circuit devices (ICs) and, more particularly, to a fuse structure for use within ICs. In accordance with the inventive arrangements, the fuse structure can be constructed using a single contact as a fuse link. The fuse structure can include two parallel nodes coupled by the fuse link. The first node can be constructed of a region of a metal layer, such as a metal interconnect layer. The second node can be constructed of a region of a conductive material on a lower horizontal process layer than the metal layer. The fuse link can be implemented as a single contact perpendicularly disposed to couple with each of the two nodes. Orienting the fuse link perpendicular to the nodes increases current crowding through the fuse link during programming. Increased current crowding in the fuse link causes increased temperature and electromigration effects within the fuse link. As a result, lower programming voltages are required to induce sufficient electromigration with respect to the single contact in order to break the fuse link and change the programming state of the fuse.

Figure 1:
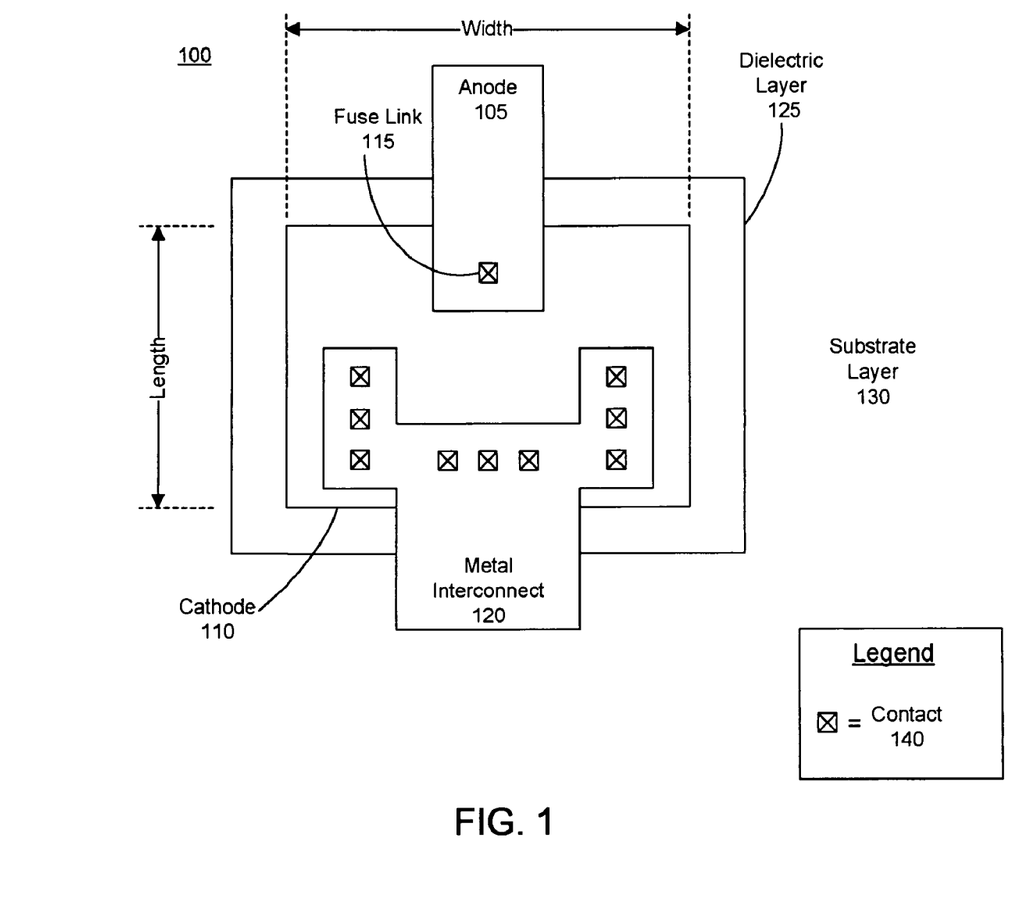
FIG. 1 is a first topographical view illustrating a fuse structure for use within a semiconductor integrated circuit (IC) in accordance with one embodiment of the present invention.

FIG. 1 is a first topographical view illustrating a fuse structure (cfuse) 100 for use within an IC in accordance with one embodiment of the present invention. Fuse structure 100 is referred to as a "cfuse" in that a contact is utilized as a fuse link, as will be described in further detail within this specification. Cfuse 100 is a type of programmable, electronic fuse that, in one embodiment can be implemented with a dielectric isolation layer separating the fuse structure from an underlying substrate layer. Cfuse 100 can include an anode 105, a cathode 110, and a fuse link 115.

Anode 105 can be formed of a region of a metal layer available within an IC manufacturing process. For example, anode 105 can be implemented with a metal one interconnect layer, i.e., a closest interconnect layer to substrate layer 130. The phrase "substrate" or "substrate layer," as used within this specification, refers to a base or bottom diffusion layer of a semiconductor silicon wafer within, and upon, which an IC is constructed. The dimensions of anode 105 can be determined by the performance characteristics to which cfuse 100 is designed. For example, the dimensions of anode 105 can be increased when large current carrying capacities are required during the programming of cfuse 100.

Cathode 110 can be formed of a region of a conductive layer on a different horizontal process layer than the metal layer of anode 105. The conductive layer can be any metalized process layer of the IC manufacturing process that is subject to electromigration effects. For example, cathode 110 can be implemented with a top layer of a metal oxide field effect transistor (MOSFET) gate stack, whether a metal gate or a silicided polysilicon gate. A gate stack refers to the process layers used to implement the gate terminal of a MOSFET device.

Cathode 110 can be coupled to metal interconnect 120 with two or more contacts 140. In one embodiment, the two or more contacts 140 can at least partially surround, or encompass, fuse link 115 on three sides in a u-shaped arrangement as shown. Surrounding fuse link 115 on three sides with contacts 140 distributes current flowing out of fuse link 115 evenly throughout cathode 110. Evenly distributing the current in the cathode 110 reduces current density within cathode 110 during programming. Accordingly, the current density, and electromigration, within fuse link 115 is greater than within cathode 110 during programming. As a result, the probability of the "break" occurring within fuse link 115 is greater than the probability of such a break occurring within cathode 110 during the programming of cfuse 100.

As shown, cathode 110 can be rectangular in shape. In one embodiment, cathode 110 exhibits no narrowing along any edge, e.g., either the length and/or the width. In another embodiment, cathode 110 has a width that exceeds the length. As shown in FIG. 1, the width generally is perpendicular to an axis through fuse link 115 to contacts 140 on metallization layer 120. Such an embodiment reduces the distance between fuse link 115 and contacts 140 that couple metallization layer 120 with cathode 110.

In one embodiment, cathode 110 can be disposed atop of optional layer 135, which is in turn disposed atop of dielectric layer 125. Optional layer 135 can be comprised of one or more process layers of an IC manufacturing process that can be disposed between cathode 110 and dielectric layer 125 as shown. Optional layer 135 can be conductive or non-conductive. In one embodiment, optional layer 135 can represent one or more process layers of a gate stack structure of an IC manufacturing process that typically resides between cathode 110 and dielectric layer 125. Cfuse 100 seeks to provide portability across a plurality of different IC manufacturing processes by implementing the various structures of cfuse 100 using process layers common to each of the plurality of different IC manufacturing processes.

For example, a gate stack structure of a complementary metal-oxide semiconductor (CMOS) manufacturing process used to implement structures of cfuse 100 can vary in type and in the number of process layers used to implement the gate stack structure. When implementing cfuse 100 within a metallized gate stack structure, cathode 110 can be implemented with the top level metal of the gate stack structure. Optional layer 135, comprising one or more layers, can be disposed between cathode 110 and dielectric layer 125 as shown. By comparison, when implementing cfuse 100 using a silicided polysilicon gate structure, cathode 110 can be comprised of two process layers, e.g., the silicide layer and the polysilicon layer, with no intervening process layer between cathode 110 and dielectric layer 125. In that case, optional layer 135 is not present within cfuse 100.

Metal interconnect 120 couples to, and allows the routing of, cathode 110 to other nodes within the IC device. As with anode 105, the dimensions of cathode 110 can be determined by the performance characteristics to which cfuse 100 is designed. The number of contacts 140 used to couple the conductive layer of cathode 110 to metal interconnect 120 can be determined by the performance characteristics to which cfuse 100 is designed. For example, the number of contacts 140 used to couple cathode 110 to metal interconnect 120 can be increased when large current carrying capacities are required during the programming of cfuse 100.

It should be noted, as will be described later within this specification, that cfuse 100 can be programmed with programming voltages of either polarity and, as such, current can flow in either direction through nodes 105 and 110. As current can flow in either direction though nodes 105 and 110 of cfuse 100, the labeling of one node as anode and the other node as cathode is for illustrative purposes only and is not intended to limit the embodiments of the invention. Node 105 can serve as either anode or cathode, as can node 110. The designation of nodes 105 and 110 as either anode or cathode during programming can vary according to the programming polarity desired for a particular implementation of cfuse 100.

Fuse link 115 comprises a conductive material positioned substantially perpendicular to the process layers comprising anode 105 and cathode 110. Referring to FIG. 1, fuse link 115 can be formed of a single contact 140 with an upper end of fuse link 115 coupled to anode 105 and the lower end of fuse link 115 coupled to cathode 110. As pictured, anode 105 and cathode 110 are coupled to opposing ends of fuse link 115. The material used to implement fuse link 115 can include any contact material, for example, tungsten, of an IC manufacturing process which is subject to electromigration effects.

Dielectric layer 125 provides electrical isolation of cfuse 100 from surrounding substrate layer 130. Dielectric layer 125 can be implemented using any dielectric material available within an IC manufacturing process capable of electrically isolating cathode 110 from substrate layer 130, e.g., a field or a gate oxide. Dielectric layer 125 can be disposed directly beneath cathode 110 and extend at least to the outer perimeter of cathode 110. Positioned in this manner, dielectric layer 125 assures that current generated during programming of cfuse 100 is not diverted away from cfuse 100 and, as such, flows between anode 105 and cathode 110.

In operation, a programming voltage can be applied across anode 105 and cathode 110. As used within this specification, the phrase "programming voltage," refers to a voltage potential applied across cfuse 100, i.e., across anode 105 and cathode 110, that generates a current flow through cfuse 100 of sufficient density to induce electromigration of conductive material across fuse link 115. The movement of conductive material across, and away from, fuse link 115, results in an increase in the resistance of the conductive path between anode 105 and cathode 110. Accordingly, "programming" or "to program" a fuse, refers to a one time application of a programming voltage to the fuse that "breaks" or changes the resistance of the conductive path through the fuse. When programming a fuse, the programming voltage can be measured in terms of magnitude and time of application so that the resistance of the conductive path between anode 105 and cathode 110 increases by a predetermined or expected amount, or increases within a predetermined or known range. Additionally, the magnitude of the programming voltage can be limited by dielectric layer 125. Dielectric layers such as gate oxide, for example, can be susceptible to damage or "punch-through" when exposed to excessive electric fields. This susceptibility limits the magnitude of the voltage that can be applied when programming cfuse 100

For example, in a conventional fuse programming circuit, an electronically programmable fuse (e-fuse) can be coupled in series with a MOSFET switch (not shown). The MOSFET switch can be coupled across a power supply provided within an IC. An anode of the e-fuse can be coupled to a most positive potential of the power supply and a cathode of the e-fuse can be coupled to the drain terminal of the MOSFET switch. The source terminal of the MOSFET switch can be coupled to the most negative potential of the power supply. In order to program the e-fuse, a bias voltage can be applied to the gate terminal of the MOSFET switch, thereby enabling current flow through the MOSFET switch and the e-fuse.

Typically, in conventional fuse programming circuits, the gate terminal of the MOSFET switch is biased to fully enable the MOSFET switch. In that case, a voltage potential appearing across the anode and the cathode of the e-fuse is approximately equal to the voltage potential of the power supply. Accordingly, the programming voltage applied to the e-fuse is approximately equal to the voltage potential of the power supply. Additionally, the current through the e-fuse is approximately equal to the current through the MOSFET switch.

In conventional e-fuses, the fuse link is implemented as a segment of conductive material physically connecting the anode and the cathode of the e-fuse. The anode, the cathode, and the fuse link is implemented as a continuous region of the conductive material within a single horizontal plane of a process layer. The fuse link is typically narrower than the anode and cathode in order to increase current density through the fuse link. Increasing the current density within the fuse link increases electromigration of the conductive material used to implement the fuse link, the anode, and the cathode. Increasing electromigration of the conductive material comprising the fuse link, increases the probability that a "break" in conductive material of the e-fuse will occur within the fuse link. When programming an e-fuse, the programming voltage, and the current generated by the application of the programming voltage, must be controlled in order to induce a desired increase in the resistance of the conductive path through the e-fuse subsequent to application of the programming voltage.

The fuse link of a conventional e-fuse is typically implemented using process layers that generate gate structures, or a "gate stack," within an IC manufacturing process flow. Examples of the process layers in the gate stack can include, but are not limited to, a field oxide or dielectric layer, a polysilicon layer, and layer of metal silicide or other conductive material. Using the process gate stack, the anode, the cathode, and the fuse link of a conventional e-fuse are constructed with the metal silicide and polysilicon layers of the process flow on a same horizontal plane.

In modern submicron IC processes, a variety of process steps have been added to offset effects created by reductions in MOSFET device sizing, e.g., short channel effects, leakage currents, and the like. For example, metal gates or hi-k dielectrics can be used in the gate stack to address effects created by reduced MOSFET device sizing. As a result, the conductive layer used to implement the fuse link of the e-fuse can vary between manufacturing processes. At times, these process steps can be adjusted to fine tune device performance during the IC manufacturing process. As the dimensions of a fuse link are designed to meet particular programming requirements for each e-fuse, variations in the material used to implement the conductive layer of the fuse link can contribute to inconsistent programming performance by the e-fuse. In that case the requirements for the gate stack layers of an IC process flow can be in conflict with the performance needs of a conventional e-fuse that is implemented in the IC process flow. In addition, the difference in gate stack layers from one IC manufacturing process to another can create difficulties when porting conventional e-fuse structures between different IC manufacturing processes.

Fuse link 115 of cfuse 100 is implemented with a contact 140 that, typically, is not subject to process adjustments. By implementing fuse link 115 with a single contact 140, current flowing through cfuse 100 is contained within the structure of the single contact 140. Limiting the current path from anode 105 to cathode 110 through the single contact 140 increases the current density through fuse link 115 when programming cfuse 100. Additionally, the perpendicular coupling of fuse link 115 to anode 105 and cathode 110 causes further increases in the current density at the coupling point between anode 105, cathode 110, and/or fuse link 115.

The high current density within fuse link 115 during programming, as well as the heat generated by the high current density, increases electromigration effects within fuse link 115. With increased electromigration, fuse link 115 can require less current through cfuse 100, as compared to conventional e-fuses, to "break" fuse link 115 during programming. Accordingly, cfuse 100 can be programmed at a lower programming voltage. To achieve similar levels of low programming voltage in a conventional e-fuse, the width of the silicided material comprising the fuse link is narrowed. As the width of the silicided material comprising the fuse link of the conventional e-fuse is reduced, the ability to reproducibly manufacture that fuse link width decreases, thereby reducing reliability of the e-fuse.

In one embodiment, cfuse 100 can be programmed by reversing the polarity of the programming voltage and generating a current flow from node 110 to node 105. Programmed in this manner, cfuse 100 can demonstrate programming characteristics, i.e., programming voltage and current, that differ from programming characteristics demonstrated when the programming current flows from node 105 to node 110. As such, cfuse 100 can demonstrate two distinct sets of programming characteristics within a same cfuse implementation depending upon the polarity of the programming voltage used.

Figure 2:
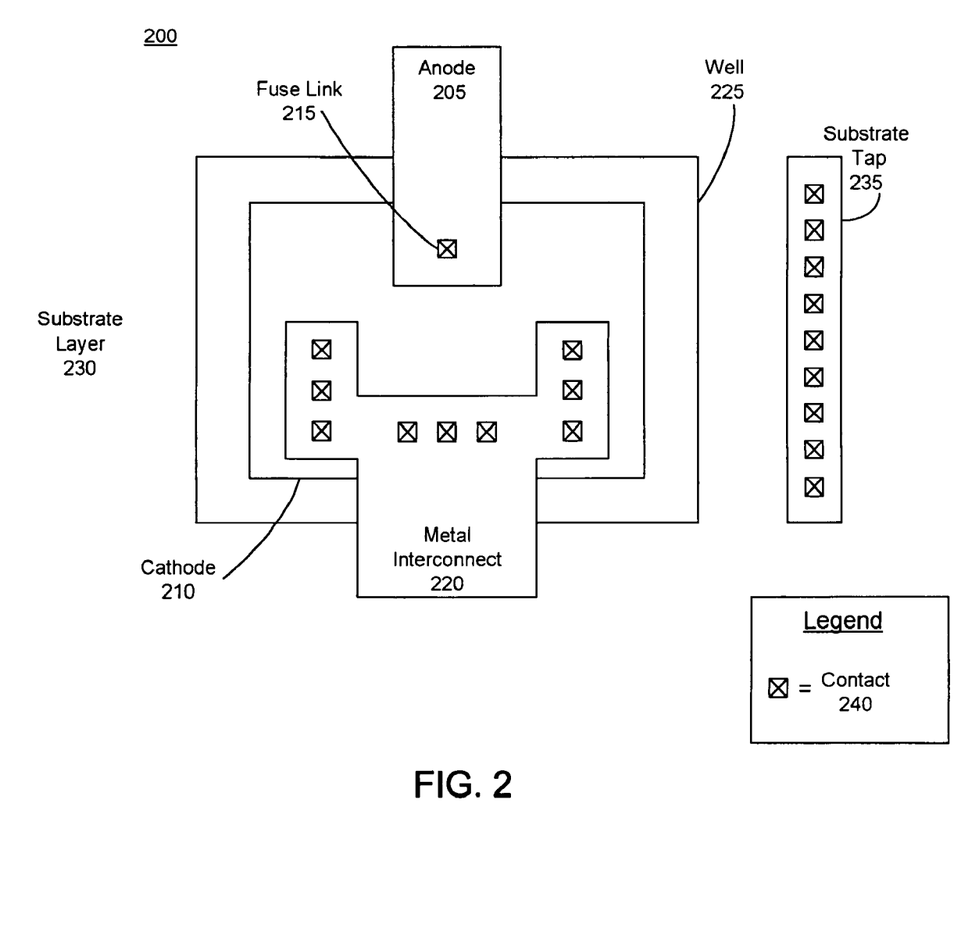
FIG. 2 is a second topographical view illustrating a fuse structure for use within an IC in accordance with another embodiment of the present invention.

FIG. 2 is a second topographical view illustrating a cfuse 200 for use within an IC in accordance with another embodiment of the present invention. Cfuse 200 is a type of programmable electronic fuse that can be implemented without a dielectric isolation layer separating the fuse structure from an underlying substrate layer. Cfuse 200 can include an anode 205, a cathode 210, a fuse link 215, and a well 225.

Within cfuse 200, anode 205 and fuse link 215 can be implemented in a substantially similar manner as anode 105 and fuse link 115 of cfuse 100. Accordingly, anode 205 can be formed of a metal layer available within an IC manufacturing process. Fuse link 215 can be formed of a single contact 240, positioned substantially perpendicular to the process layers implementing anode 205 and cathode 210. An upper end of fuse link 215 can be coupled to anode 205 and the lower end of fuse link 215 can be coupled to cathode 210.

Cathode 210 can be formed of a conductive layer of the IC manufacturing process deposited directly atop a diffusion material. Cathode 210 can be coupled to metal interconnect 220 by two or more contacts 240. In one embodiment, the two or more contacts 240 can at least partially surround fuse link 215 on three sides in a u-shaped arrangement. In addition, cfuse 200 lacks a dielectric layer under cathode 210. The conductive layer of cathode 210 can be in direct contact with the underlying diffusion material. The conductive layer can include any conductive material used as an IC process layer that can be deposited to directly overlay a diffusion material in a manner that electrically couples the conductive layer to the diffusion material. The conductive material is, or includes, a material that is susceptible to electromigration effects. For example, various metal silicides that exhibit electromigration effects can be deposited upon the diffusion material and serve as the conductive material.

As implemented in cfuse 200, cathode 210 can be disposed within a well 225 formed of an N-type or P-type material. Well 225 can be disposed within substrate layer 230. The term "well," as used within this specification, refers to a tub of N-type or P-type material disposed within an IC substrate layer or an N-type or a P-type material that is different from the N-type or P-type material forming the well. Cfuse 200 can include an optional well tap (not shown) with one or more contact(s) 240 that can couple the N-type or P-type material of well 225 to metal interconnect lines within the IC. With the optional well tap, well 225 can be biased to a desired voltage potential. Well 225 can electrically isolate cathode 210 from devices within surrounding substrate layer 230. In addition, a dielectric layer (not shown), for example field oxide, can surround an outer perimeter of cathode 210. The dielectric layer can electrically isolate, in a horizontal direction, cathode 210 from devices within the surrounding substrate layer 230.

Substrate tap 235 can be formed as a silicided substrate region with one or more contact(s) 240 that couple substrate layer 230 to metal interconnect lines within the IC. Substrate tap 235 can be coupled to a predetermined voltage potential provided within the IC, thereby biasing substrate layer 230 to the predetermined voltage potential.

In operation, the programming of cfuse 200 is performed in a manner substantially similar to that of cfuse 100 of FIG. 1. In general, the operation and other properties of cfuse 200 reflect those of cfuse 100 described earlier within this specification. However, cfuse 200 differs from cfuse 100 in the structure implemented to electrically isolate the cathode 110 from devices within surrounding substrate layer 230. As implemented within cfuse 200, electrical isolation of the cathode 210 from devices within surrounding substrate layer 230 is accomplished by disposing cathode 210 within well 225. Additionally, when well 225 and substrate layer 235 are properly biased, well 225 can provide junction isolation of cathode 210 from devices within substrate layer 230.

Figure 3:
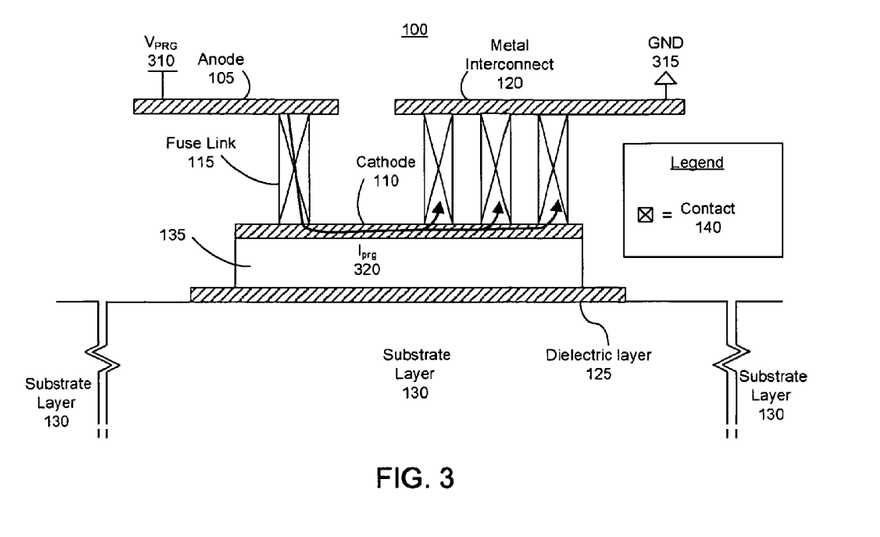
FIG. 3 is a first cross-sectional side view illustrating the fuse structure of FIG. 1 in accordance with another embodiment of the present invention.

FIG. 3 is a first cross-sectional side view illustrating cfuse 100 of FIG. 1 in accordance with another embodiment of the present invention. As such, like numbers will be used to refer to the same items throughout this specification. FIG. 3 illustrates the implementation of anode 105 and cathode 110 using two distinct process layers residing on two differing horizontal planes. Fuse link 115 is positioned substantially perpendicular to the horizontal planes within which anode 105 and cathode 110 are implemented. In addition, FIG. 3 illustrates the coupling of fuse link 115 at approximately a 90 degree angle to anode 105 and cathode 110.

To program cfuse 100, a voltage potential can be coupled across anode 105 and cathode 110. Thus, as pictured, a voltage denoted as $V_{prg}$ 310 is coupled to anode 105, while cathode 110 is coupled to ground, e.g., GND 315, via metal interconnect 120. Accordingly, a voltage potential moving from anode 105 to cathode 110, varies between $V_{prg}$ 310 and GND 315. Referring to FIG. 3, a programming current, denoted as $I_{prg}$ 320, is generated during application of the programming voltage that flows from anode 105, through fuse link 115, to cathode 110. As fuse link 115 is a single contact coupling the process layers comprising anode 105 and cathode 110, $I_{prg}$ 320 is concentrated into the single contact. Additionally, as $I_{prg}$ 320 flows through the coupling points between anode 105 and fuse link 115, and fuse link 115 and cathode 110, the current flow of $I_{prg}$ 320 changes direction by approximately 90 degrees.

Concentrating $I_{prg}$ 320 into a single contact, i.e., fuse link 115, combined with current crowding known to occur at right angle bends, results in increased electromigration effects from $I_{prg}$ 320 as it flows through fuse link 115. The increased electromigration effects within fuse link 115 generate a change of resistance in the conductive path through cfuse 100 at a reduced programming voltage from that required for conventional e-fuses. The reduced programming voltage is valuable in IC devices operating at reduced power supply voltages, e.g., 1.5V.

Figure 4:
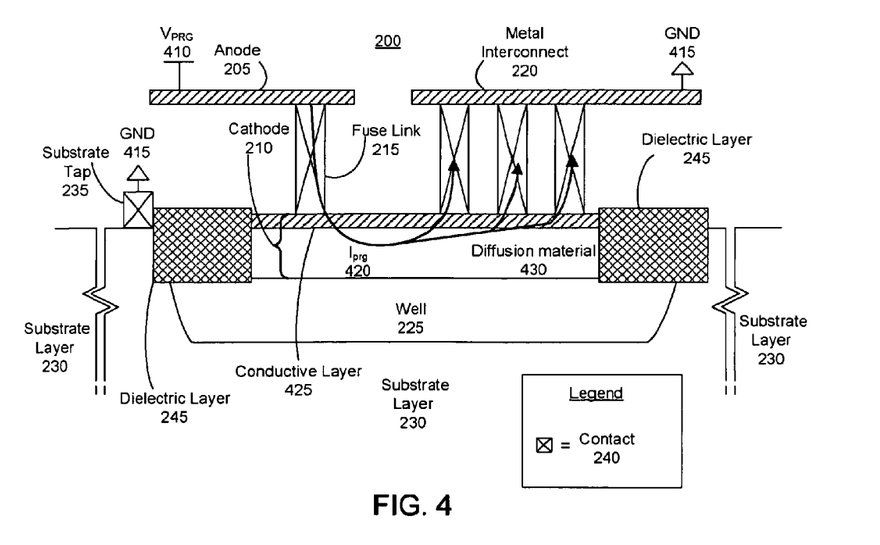
FIG. 4 is a second cross-sectional side view illustrating the fuse structure of FIG. 2 in accordance with another embodiment of the present invention.

FIG. 4 is a second cross-sectional side view illustrating cfuse 200 of FIG. 2 in accordance with another embodiment of the present invention. Cfuse 200 can be implemented without an isolating dielectric layer between cathode 210 and substrate layer 230. Cathode 210 is implemented with a conductive layer 425 coupled to, and overlaying, a diffusion material 430. Cathode 210 is dispose within, and surrounded by, well 225. As implemented in cfuse 200, well 225 electrically isolates cathode 210 from substrate layer 230. Dielectric layer 245 horizontally surrounds conductive layer 425 and diffusion material 430 of cathode 210. Dielectric layer 245 physically and electrically isolates cathode 210 from substrate layer 230 in a horizontal direction. Within the embodiment illustrated in FIG. 4, cathode 210 comprises diffusion material 430.

To program cfuse 200, a voltage denoted as $V_{prg}$ 410 is coupled to anode 205, while cathode 210 is coupled to ground, e.g., GND 415 via metal interconnect 220. Accordingly, a voltage potential across cfuse 200, moving from anode 205 to cathode 210, varies between $V_{prg}$ 410 and GND 415. A programming current, denoted as $I_{prg}$ 420, is generated during application of the programming voltage that flows from anode 205, through fuse link 215, to cathode 210. Although most of $I_{prg}$ 420 flows through the conductive layer 425 of cathode 210, a lesser amount of current can flow though the diffusion material 430 of cathode 210. Dielectric layer 245 can create a physical and electrical barrier that prevents $I_{prg}$ 420 from flowing laterally to surrounding substrate layer 230. Reverse biasing well 225 with respect to diffusion material 430 also prevents $I_{prg}$ 420 from flowing into substrate layer 230. Preventing $I_{prg}$ 420 from flowing to surrounding substrate layer 230, can assure that $I_{prg}$ 420 consistently flows from anode 205 to cathode 210, resulting in reproducible fuse behavior.

Figure 5:
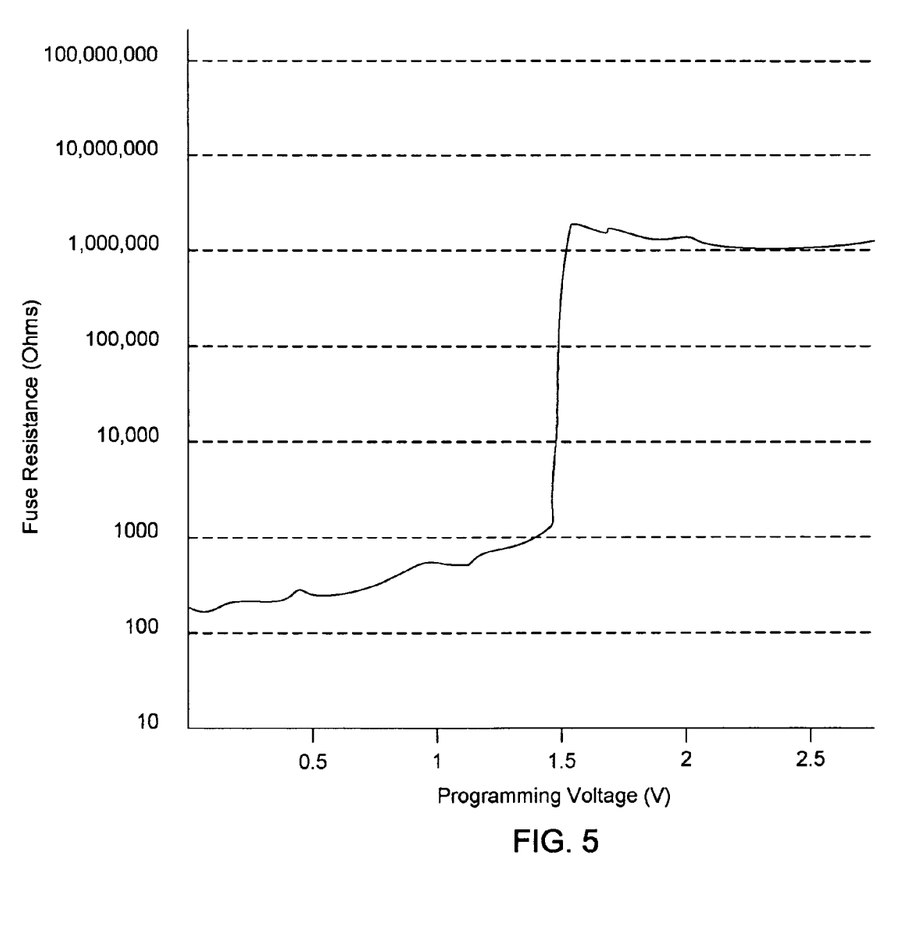
FIG. 5 is graph illustrating resistive change within a fuse structure in response to an applied programming voltage in accordance with another embodiment of the present invention.

FIG. 5 is a graph 500 illustrating resistive changes within a cfuse structure in response to an applied programming voltage in accordance with another embodiment of the present invention. FIG. 5 illustrates the resistive change that can be achieved within one of the cfuses described with reference to any of FIG. 1, 2, 3, or 4. Graph 500 illustrates a quantity of resistance increase in a conductive path through such a cfuse that can be achieved subsequent to programming. The values of the resistive change presented within graph 500 are exemplary only and can vary according to design parameters used to implement the cfuse as well as the IC manufacturing process used to implement the cfuse. As such, graph 500 is not intended to be limiting, but rather to aid in providing an understandable description of the embodiments of the invention. Within graph 500, the vertical axis represents the resistance of a conductive path through the cfuse. The horizontal axis represents the programming voltage $V_{PRG}$ that is applied to the cfuse.

Graph 500 represents a programming voltage, applied across an anode and a cathode of the cfuse, wherein the programming voltage is increased from 0 volts to 2.5 volts and the current flowing through the cfuse is measured and recorded. Using the current measurements, the resistance of the cfuse structure for each value of the programming voltage can be calculated. The calculated resistance of the conductive path through the cfuse at each level of programming voltage applied to the cfuse is plotted in graph 500.

As illustrated in graph 500, the resistance of the conductive path through the cfuse prior to programming is approximately 100 ohms. As the programming voltage applied to the cfuse is increased, the current generated within the cfuse by the programming voltage $V_{PRG}$ also increases, which increases the amount of conductive material of the fuse link that electromigrates. The increased electromigration effect manifests itself in Graph 500 in the form of increased resistance of the conductive path through the cfuse.

Within the cfuse, electromigration effects are magnified by the implementation of the fuse link with a single contact connecting the anode and the cathode of the cfuse. With only the single contact as the conductive path between the anode and the cathode, current density is greatly increased within the fuse link of the cfuse. Additionally, the fuse link, i.e., the single contact, is coupled at substantially right angles to the anode and the cathode. The right angle coupling of the fuse link to the anode and the cathode causes further increases in current density at the coupling point between the anode and/or the cathode, and the fuse link as the current flow changes direction by 90 degrees. The high current densities generated at the right angle coupling points of the fuse link during programming, as well as the heat generated by the high current densities, increases electromigration effects at the coupling points.

With increased electromigration at the right angle coupling points of the fuse link, the coupling points become the most stressed point in the conductive path through the cfuse. Additionally, less current is required through cfuse 100 to "break" the fuse link during programming and create a more resistive conductive path through the cfuse. Accordingly, the cfuse can be programmed at a lower programming voltage than a conventional e-fuses.

At approximately 1.5 volts of programming voltage, an inflection point occurs within graph 500. At the 1.5 volt inflection point, the resistance of the conductive path through the cfuse significantly increases from approximately 1K ohm to approximately 1M ohm. The increase in resistance to 1M ohm illustrates a programming voltage that displaces sufficient conductive material through electromigration to cause a "break" in the conductive material along the fuse link of the cfuse. The two values for the resistance of the conductive path through the cfuse prior to, and subsequent to, the 1.5 volt inflection point in graph 500, i.e., 1K ohm and 1M ohm, represent two possible programming states for the cfuse. Accordingly, the state of the cfuse, as embodied with respect to graph 500, can be changed with a programming voltage of approximately 1.5 volts or more.

Depending upon programming conditions, e.g., programming voltage magnitude and direction, manufacturing process, and cfuse design features, the region within the cfuse responsible for the resistive change in the conductive path through the cfuse can vary. As the coupling points of the fuse link to both anode and cathode are the locations generating the greatest electromigration effects, the region surrounding each coupling point has the highest probability of failure, and thus, a resulting increase in resistivity of the cfuse upon failure. For example, electromigration can cause voids in the tungsten material at the upper or lower ends of the contacts. In another example, a void in the conductive layer of the cathode can occur where the lower end of fuse link contacts the cathode.

Typically, conventional e-fuses require programming voltage greater than 2.5 V to change programming states. As IC manufacturing process technology continues to scale down feature sizes, power supply voltages powering IC devices need to be reduced. Many modern IC manufacturing processes require power supply voltages below 2.5 V, for example, 1.5 or 1.8V power supplies, to prevent damage to devices internal to an IC manufactured using such processes. The reduced programming voltage of the cfuse allows programming to be performed using power supplies inherent within a low voltage IC application. For example, an IC device designed to operate with a maximum 1.8V power supply can perform a programming operation on the cfuse illustrated in FIG. 5 with a 1.5V programming voltage. Implementing a conventional e-fuse within the same 1.8 V powered IC device would require an additional power supply to provide the approximately 2.5V necessary to program the conventional e-fuse.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements. Two elements, for example, can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A fuse structure for a semiconductor integrated circuit (IC), the fuse structure comprising:
   a first node comprising a region of a metal layer of an IC manufacturing process;
   a second node comprising a region of a conductive layer below the metal layer of the first node;
   a fuse link, comprising a conductive material, positioned substantially perpendicular to each of the metal and conductive layers, wherein an upper end of the fuse link couples to the first node and a lower end of the fuse link, that is distal to the upper end, couples to the second node;
   wherein the second node has rectangular surface perpendicular to the fuse link;
   a plurality of contacts coupled to the second node and disposed in a u-shaped arrangement, wherein:
      the u-shaped arrangement at least partially surrounds three sides of the fuse link, and
      each contact is substantially perpendicular to each of the metal and conductive layers.

2. The fuse structure of claim 1, wherein the fuse link is implemented using a single contact of the IC manufacturing process.

3. The fuse structure of claim 1, further comprising a dielectric layer, underlying the conductive layer, wherein the dielectric layer electrically isolates the conductive layer from other devices on the IC.

4. The fuse structure of claim 1, wherein the conductive layer is a silicided polysilicon layer.

5. The fuse structure of claim 1, wherein the conductive layer is a top layer of a metalized gate stack.

6. The fuse structure of claim 1, wherein the conductive layer is a silicided diffusion region.

7. The fuse structure of claim 6, wherein the silicided diffusion region is disposed within a substrate layer.

8. The fuse structure of claim 7, further comprising a substrate tap, comprising at least one substrate contact overlaying a region of the substrate layer, wherein the substrate tap electrically couples the substrate layer to a predetermined voltage potential.

9. The fuse structure of claim 6, further comprising a well disposed within the substrate layer, wherein the silicided diffusion region is disposed within, and surrounded by, the well.

10. The fuse structure of claim 1, wherein the first node is an anode and the second node is a cathode, and wherein, during programming of the fuse structure, current flows from the first node to the second node.

11. The fuse structure of claim 1, wherein the first node is a cathode and the second node is an anode, and wherein, during programming of the fuse structure, current flows from the second node to the first node.

12. The fuse structure of claim 1, wherein the conductive layer and the fuse link each is comprised of a material that demonstrates an electromigration property responsive to an applied programming voltage.

13. A fuse structure for a semiconductor integrated circuit (IC), the fuse structure comprising:
   an anode comprising a first region of a metal layer of an IC manufacturing process;
   a cathode comprising a region of a conductive layer that is below the metal layer of the anode;
   a dielectric layer, underlying the conductive layer of the cathode, wherein the dielectric layer electrically isolates the conductive layer from the surrounding IC; and a fuse link, comprising a single contact, positioned substantially perpendicular to each of the metal and conductive layers, wherein an upper end of the fuse link couples to the anode and a lower end of the fuse link, that is distal to the upper end, couples to the cathode;

wherein the cathode has rectangular surface perpendicular to the fuse link;

a second region of the metal layer, separate from the first region, coupled to the conductive layer of the cathode via a plurality of contacts, wherein the plurality of contacts is disposed in a u-shaped arrangement, and the u-shaped arrangement at least partially surrounds three sides of the fuse link.

14. The fuse structure of claim 13, wherein the conductive layer and the fuse link each is comprised of a material that demonstrates an electromigration property responsive to an applied programming voltage.

15. A fuse structure for a semiconductor integrated circuit (IC), the fuse structure comprising:

a well comprising an N-type or a P-type material disposed within a substrate layer of the IC;

an anode comprising a first region of a metal layer of an IC manufacturing process;

a cathode comprising a region of a conductive material overlaying, and in contact with, a diffusion material, disposed within the well; and a fuse link comprising a single contact, positioned substantially perpendicular to each of the metal and conductive layers, wherein an upper end of the fuse link couples to the anode and a lower end of the fuse link, that is distal to the upper end, couples to the cathode wherein the cathode has rectangular surface perpendicular to the fuse link; a second region of the metal layer, separate from the first region, coupled to the conductive layer of the cathode via a plurality of contacts, wherein the plurality of contacts is disposed in a u-shaped arrangement, and the u-shaped arrangement at least partially surrounds three sides of the fuse link.

16. The fuse structure of claim 15, further comprising a substrate tap comprising at least one substrate contact overlaying a region of the substrate layer, wherein the substrate tap electrically couples the substrate layer to a predetermined voltage potential.

17. The fuse structure of claim 15, wherein the conductive material overlaying the diffusion material that demonstrates an electromigration property responsive to an applied programming voltage.

* * * * *